United States Patent
Kyrolainen et al.

(10) Patent No.: US 10,110,326 B1
(45) Date of Patent: Oct. 23, 2018

(54) MULTI-PROBE ANECHOIC CHAMBER (MPAC) OVER-THE-AIR (OTA) TEST SYSTEM HAVING A RADIO CHANNEL (RC) EMULATOR THAT HAS A DYNAMICALLY-VARIABLE CHANNEL MODEL, AND METHODS

(71) Applicant: Keysight Technologies, Inc., Minneapolis, MN (US)

(72) Inventors: Jukka Kyrolainen, Oulu (FI); Pekka Kyosti, Oulu (FI); Lassi Hentila, Kempele (FI); Aki Hekkala, Oulu (FI)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/721,754

(22) Filed: Sep. 30, 2017

(51) Int. Cl.
*H04B 17/391* (2015.01)
*H04B 1/10* (2006.01)
*H04B 17/00* (2015.01)
*G01R 1/06* (2006.01)
*H04B 17/29* (2015.01)
*H04B 17/16* (2015.01)

(52) U.S. Cl.
CPC .......... *H04B 17/0087* (2013.01); *G01R 1/06* (2013.01); *H04B 17/16* (2015.01); *H04B 17/29* (2015.01); *H04B 17/3911* (2015.01)

(58) Field of Classification Search
CPC .... H04B 17/0087; H04B 17/16; H04B 17/29; H04B 17/3911; H04B 1/1081; H04B 10/07; H04B 17/15; G01R 1/06; H04W 24/06
See application file for complete search history.

(56) References Cited

U.S. PATENT DOCUMENTS

| 8,805,290 | B2 | 8/2014 | Guo et al. | |
|---|---|---|---|---|
| 9,077,415 | B2 | 7/2015 | Josiam et al. | |
| 9,407,381 | B2 | 8/2016 | Kyosti et al. | |
| 9,488,685 | B2 | 11/2016 | Kyosti et al. | |
| 9,742,508 | B1* | 8/2017 | Kyosti | H04B 17/12 |
| 10,033,473 | B1* | 7/2018 | Kyrolainen | H04B 17/3912 |
| 2011/0200084 | A1* | 8/2011 | Griesing | H01Q 3/267 375/224 |
| 2011/0306306 | A1 | 12/2011 | Reed | |

(Continued)

FOREIGN PATENT DOCUMENTS

WO  2017091713 A1  6/2017

OTHER PUBLICATIONS

Pekka Kyosti et al., "Channel Modelling for Multiprobe Over-the-Air MIMO Testing", International Journal of Antennas and Propagation, vol. 2012, pp. 1-12.

(Continued)

*Primary Examiner* — Andrew Wendell

(57) ABSTRACT

An MPAC OTA test system and method are provided that can be used to perform radiated testing of 5G BSs and 5G UEs. The arrangement and number of active probe antennas in the anechoic chamber can be selected based at least in part on a simulation of the channel model of the RC emulator to improve testing while also reducing the overall number of probe antennas that are needed and reducing the channel resources of the RC emulator of the MPAC OTA test system, thereby allowing the overall complexity and cost of the MPAC OTA test system to be reduced.

24 Claims, 6 Drawing Sheets

(56) References Cited

U.S. PATENT DOCUMENTS

| | | | | |
|---|---|---|---|---|
| 2012/0309323 | A1* | 12/2012 | Guo | H04B 17/0087 455/67.14 |
| 2014/0024318 | A1 | 1/2014 | Sevindik et al. | |
| 2016/0212641 | A1* | 7/2016 | Kong | H04B 17/0087 |
| 2016/0233970 | A1* | 8/2016 | Reed | H04B 17/29 |
| 2016/0285572 | A1* | 9/2016 | Manghal | H04B 17/0085 |
| 2016/0344490 | A1* | 11/2016 | Foegelle | H04B 17/3912 |
| 2017/0019154 | A1 | 1/2017 | Reed | |
| 2017/0184698 | A1* | 6/2017 | Rueth | G01R 35/007 |
| 2017/0373773 | A1* | 12/2017 | Jing | H04B 17/318 |
| 2018/0062971 | A1* | 3/2018 | Kyosti | H04B 7/0413 |

OTHER PUBLICATIONS

Pekka Kyosti et al., "On Dimensions of OTA Setups for Massive MIMO Base Stations Radiated Testing", IEEE Access, vol. 4, 2016, pp. 5917-5981.

C. Schirmer et al. "3D wave-field synthesis for testing of radio devices," published in The 8th European Conference on Antennas and Propagation (EuCAP 2014), Apr. 2014, pp. 3394-3398.

Notice of Allowance dated May 23, 2018, U.S. Appl. No. 15/721,757, 20 pgs.

Jiann-Ching Guey et al., "Modeling and Evaluation of Beam Tracking in Mobile Millimeter Wave Communication", 2015 IEEE 26th International Symposium on Personal, Indoor and Mobile Radio Communications—(PIMRC):Fundamentals and PHY, pp. 775-780.

Wei Yu et al., "Radiated Two-Stage Method for LTE MIMO User Equipment Performance Evaluation," IEEE Transactions on Electromagnetic Compatibility, vol. 56, Dec. 2014, pp. 1691-1696.

* cited by examiner

MULTI-PROBE ANECHOIC CHAMBER (MPAC) OVER-THE-AIR (OTA) TEST SYSTEM HAVING A RADIO CHANNEL (RC) EMULATOR THAT HAS A DYNAMICALLY-VARIABLE CHANNEL MODEL, AND METHODS

BACKGROUND

In wireless systems, such as multiple input multiple output (MIMO) wireless systems, for example, multiple antennas are used on both the base station and on the mobile device to exploit a phenomenon known as multipath propagation in order to achieve higher data rates. In general, wireless systems such as MIMO systems simultaneously send and receive multiple data signals over each radio channel. The multipath propagation phenomenon is the result of environmental factors that influence the data signals as they travel between the base station and the mobile device, including, for example, ionospheric reflection and refraction, atmospheric ducting, reflection from terrestrial objects and reflection from bodies of water. Because of these factors, the data signals experience multipath interference that results in constructive interference, destructive interference, or fading, and phase shifting of the data signals. MIMO technology has been standardized in various wireless communications standards including Institute of Electrical and Electronics Engineers (IEEE) 802.11n, IEEE 802.11ac, HSPA+ (3G), WiMAX (4G) and Long Term Evolution (LTE) standards.

Base stations and mobile devices of wireless systems require testing. A typical test system for testing a mobile device under test (DUT) includes a base station or base station emulator (BS), a radio channel (RC), or fading, emulator, the mobile device under test (DUT), a personal computer (PC), some type of multi-probe configuration, and various electrical cables for interconnecting the components. This same test system configuration can be used to test the BS when the BS is the DUT. In some test systems, the output ports of the fading emulator are connected to the antenna ports of the DUT by electrical cables. This type of test system is known as a conducted test system.

Another type of test system that is used to test mobile DUTs is a multi-probe anechoic chamber (MPAC) over-the-air (OTA) test system. In a typical MPAC OTA system, the mobile DUT is located inside of an anechoic chamber that includes a multi-antenna probe configuration. The output ports of the fading emulator are connected to the respective antenna probes of the chamber. This same test system configuration can be used to test the BS when the BS is the DUT.

The latest generation of wireless systems is the $5^{th}$ generation wireless system, commonly abbreviated as "5G." It is expected that 5G wireless systems that operate in the millimeter wave spectrum (mmWave), which is between 30 GHz and 300 GHz, will employ integrated analog beamforming with fast dynamic beam switching in both the BS and the user equipment (UE) (e.g., a mobile device). It is not expected that analog beamformers will be applied at frequencies below 6 GHz, although the current signaling specification draft does not preclude it. For 5G wireless systems, OTA test methods and systems will be used to test the BS and the UE if RF antenna connectors at each antenna element are not available. It is expected that connectors for conductive radio channel emulation will be available at RF or intermediate frequency (IF) on an antenna port basis rather than on a per antenna element basis. Each antenna port will be connected to multiple antenna elements and analog beamforming with a fixed set of element weighting coefficients will be applied at each antenna port such that a different beam state may be chosen for each orthogonal frequency division multiplexing (OFDM) symbol.

A need exists for an MPAC OTA test system that can be used to test 5G BSs and 5G UEs. A further need exists for an MPAC OTA test system that can be used to test 5G BSs and 5G UEs that reduces the amount of RC emulator resources that are needed in the RC emulator and that reduces the number of antenna probes that are needed in the anechoic chamber in order to reduce the complexity and cost of the MPAC OTA test system.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
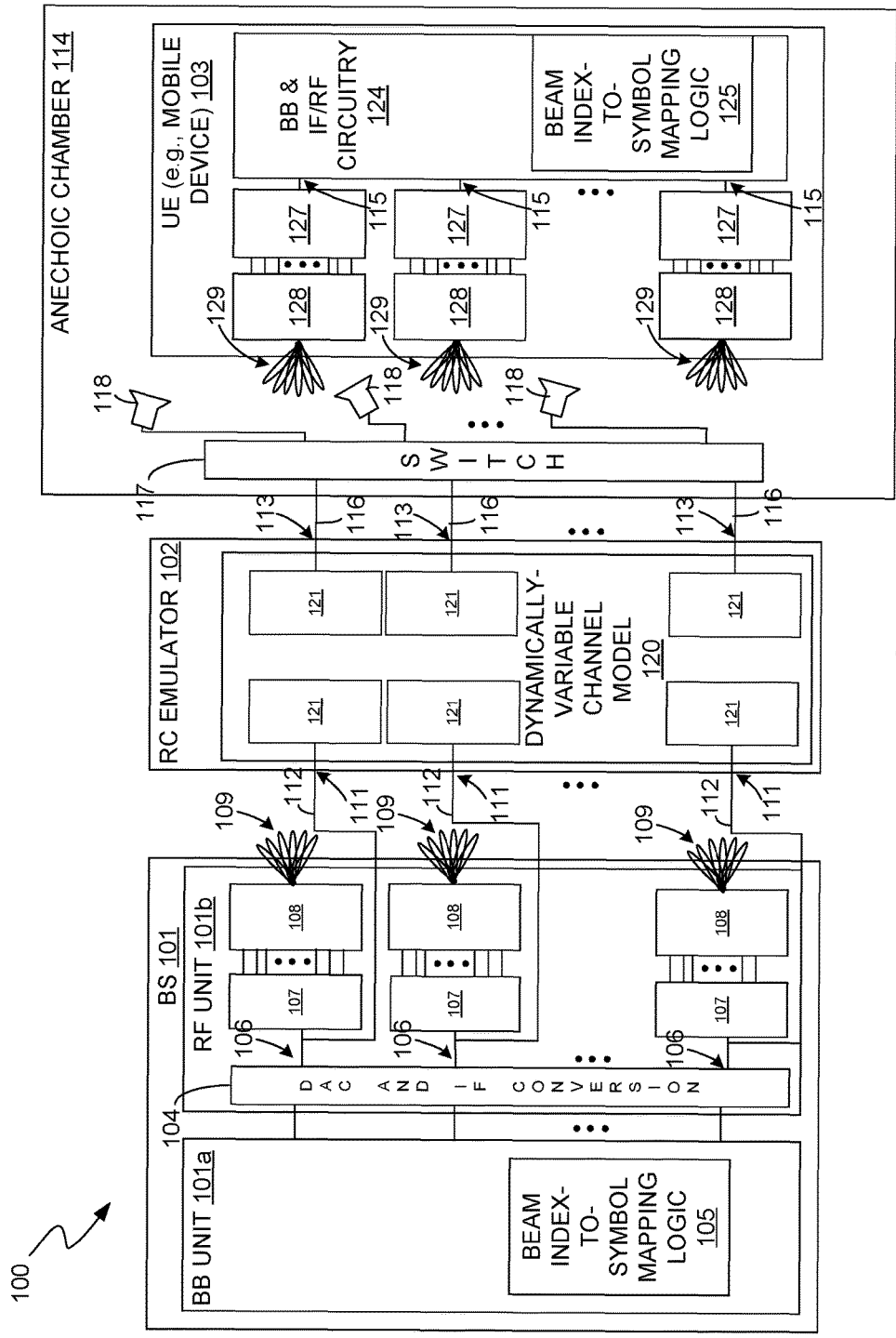
FIG. 1 is a schematic block diagram of an MPAC OTA test system in accordance with a representative embodiment that is suitable for testing a 5G DUT and that has an RC emulator that is capable of dynamically varying the antenna probe configuration of the MPAC based on changes in a dynamically-variable channel model of the RC emulator.

In accordance with representative embodiments described herein, an MPAC OTA test system is provided that can be used to perform radiated testing of 5G BSs and 5G UEs. In addition, the arrangement and number of active probe antennas in the MPAC can be selected based at least in part on a simulation of the channel model of the RC emulator to improve testing while also reducing the overall number of probe antennas that are needed and reducing the channel resources of the RC emulator of the MPAC OTA test system, thereby allowing the overall complexity and cost of the MPAC OTA test system to be reduced.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a," "an," and "the" include both singular and plural referents, unless the context clearly dictates otherwise. Thus, for example, "a device" includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" or "electrically coupled to" another element, it can be directly connected or coupled, or intervening elements may be present.

The term "memory" or "memory device", as those terms are used herein, are intended to denote a computer-readable storage medium that is capable of storing computer instructions, or computer code, for execution by one or more processors. References herein to "memory" or "memory device" should be interpreted as one or more memories or memory devices. The memory may, for example, be multiple memories within the same computer system. The memory may also be multiple memories distributed amongst multiple computer systems or computing devices.

A "processor", as that term is used herein encompasses an electronic component that is able to execute a computer program or executable computer instructions. References herein to a computer comprising "a processor" should be interpreted as a computer having one or more processors or processing cores. The processor may for instance be a multi-core processor. A processor may also refer to a collection of processors within a single computer system or distributed amongst multiple computer systems. The term "computer" should also be interpreted as possibly referring to a collection or network of computers or computing devices, each comprising a processor or processors. Instructions of a computer program can be performed by multiple processors that may be within the same computer or that may be distributed across multiple computers.

In accordance with an embodiment, the configuration of the probe antennas of the MPAC is a dynamically-selected configuration that is configured during radiated testing. In accordance with another representative embodiment, the configuration of the probe antennas of the MPAC is a semi-static configuration that is preselected prior to performing radiated testing.

When the UE is the DUT, a semi-static configuration of the probe antennas of the MPAC is preselected based at least in part on M selected BS antenna array beam patterns of N BS antenna array beam patterns, where N and M are positive integers, N is the total number of BS antenna array beam patterns that the BS has, and M is less than N. In accordance with a representative embodiment, the M selected BS antenna array beam patterns are the M strongest BS antenna array beam patterns. The RC emulator or some other computer running a channel modeling software application program performs a beam power simulation and determines the M strongest BS antenna array beam patterns by calculating the Beam Reference Signal Received Power (BRSRP) or the total received power at the UE DUT for each of the BS antenna array beam patterns where, for example, unity transmit (Tx) power can be applied to observe the relative difference between the beam powers. A composite reference channel model of the M strongest BS antenna array beam patterns is constructed and a probe antenna configuration that is optimized for the composite reference channel model is preselected.

If the available probe antenna spacing is dense enough to fulfill the Nyquist sampling criterion of the power angular spectrum (PAS) of the composite reference channel model within the test zone of the DUT in the chamber, the required number of probe antennas can be calculated and the probe locations can be optimized based on known methods described in an article entitled "Channel modelling for multiprobe over-the-air MIMO testing," published in *International Journal of Antennas and Propagation*, vol. 2012, 2012, by P. Kyösti, T. Jämsä, and J.-P. Nuutinen, and an article entitled "3D wave-field synthesis for testing of radio devices," published in *The 8th European Conference on Antennas and Propagation* (*EuCAP* 2014), April 2014, pp. 3394-3398 by C. Schirmer, M. H. Landmann, W. A. T. Kotterman, M. Hein, R. S. Thomä, G. D. Galdo, and A. Heuberger, both of which are incorporated by reference herein.

If the probe antenna spacing is sparse, such that the Nyquist sampling criterion is not fulfilled, the required number of probe antennas can be determined by simulating the MPAC OTA system with the composite reference channel model against known performance metrics, such as, for example, spatial correlation error within the test zone. The probe antenna selection, i.e., the locations of the probe antennas for the given number of probe antennas, can be obtained from the simulation, during which the probe antenna locations can be searched by, for example, applying a numerical optimization method to minimize a certain cost-function such as, for example, a spatial correlation error or a reconstructed PAS error.

The UE DUT antenna characteristics may be included in the beam power simulation if they are known, as will now be described. The semi-static configuration of the probe antennas of the MPAC may be preselected based at least in part on the M strongest BS, UE antenna array beam pattern pairs. The RC emulator or some other computer running a channel modeling software application program performs a beam simulation and determines the M strongest BS, UE antenna array beam pattern pairs by calculating the BRSRP or the total received power at the DUT for each of the BS, UE antenna array beam pattern pairs. A composite reference channel model of the M strongest BS, UE antenna array beam patterns is constructed and a probe antenna configuration that is optimized for the composite reference channel model is preselected.

When the BS is the DUT, the semi-static configuration of the probe antennas of the MPAC is preselected based at least in part on the M strongest UE antenna array beam patterns of Q UE antenna array beam patterns, where Q is the total number of UE antenna arrays, and M is less than Q. In accordance with this representative embodiment, the RC emulator or some other computer running a channel modeling software application program performs a beam power simulation that determines the M strongest UE antenna array beam patterns by calculating the BRSRP or the total received power at the BS DUT for each of the UE antenna array beam patterns. A composite reference channel model of the M strongest UE antenna array beam patterns is constructed and a probe antenna configuration that is optimized for the composite reference channel model is preselected.

The BS DUT antenna characteristics may be included in the beam power simulation if the BS DUT beam patterns are known, as will now be described. In the case of a semi-static configuration of the probe antennas, the configuration may be preselected based at least in part on the M strongest BS, UE antenna array beam pattern pairs. The RC emulator, or some other computer running a channel modeling software application program, performs a simulation that determines the M strongest BS, UE antenna array beam pattern pairs by calculating the BRSRP or the total received power at the BS DUT for each of the BS, UE antenna array beam pattern pairs. A composite reference channel model of the M strongest BS, UE antenna array beam pattern pairs is constructed and a probe antenna configuration that is optimized for the composite reference channel model is preselected.

FIG. 1 is a schematic block diagram of an MPAC OTA test system 100 in accordance with a representative embodiment that is suitable, but not limited to, testing 5G BSs and 5G UE (e.g., mobile devices). In accordance with this representative embodiment, a configuration of antenna probes 118 of an MPAC 114 of the test system 100 is a dynamically-selected configuration made during testing by an RC emulator 102 of the test system 100 via a switch 117 of the test system 100 based on changes in a dynamically-variable channel model 120 of the RC emulator 102. In accordance with this representative embodiment, the test system 100 comprises a 5G BS 101, the RC emulator 102, the 5G UE 103 which, for exemplary purposes, is assumed to be a 5G mobile device, such as a 5G smart phone, for example, and the MPAC 114.

Either the BS 101 or the UE 103 may be the DUT. The following description of FIG. 1 assumes that the UE 103 is the DUT and describes the manner in which the MPAC OTA test system 100 is used to test the UE 103. When the UE 103 is being tested, the BS 101 may be an actual BS or a BS emulator. When the BS 101 is being tested, the UE 103 may be an actual UE or a UE emulator. The term "UE," as that term is used herein, denotes an actual UE or a UE emulator when the BS 101 is being tested. The term "BS," as that term is used herein, denotes an actual BS or a BS emulator when the UE 103 is being tested. It should be noted that in cases in which the BS 101 is a BS emulator, the RC emulator 102 may be part of, and internal to, the BS emulator. Likewise, in cases in which the UE 103 is a UE emulator, the RC emulator 102 may be part of, and internal to, the UE emulator.

The BS 101 has a baseband (BB) unit 101a that generates radio frames that, in accordance with an embodiment, are made up of OFDM symbols. The BB unit 101a includes beam indices-to-symbol mapping logic 105 that maps beam indices to symbols. The structure of the radio frame that is used is implementation dependent, and therefore the inventive principles and concepts are not limited to any particular radio frame structure. A Verizon 5G Test Plan For Air Interface provides that each radio frame is 10 millisecond (ms) in duration and to has one-hundred slots, with each slot having a length of $T_{slot}=15360 \times T_S=0.1$ ms, where $T_S=1/(75000 \times 2048)$, where two consecutive slots form a subframe, and where each slot contains seven OFDM symbols. However, other frame structures may be used, as will be understood by those skilled in the art. For illustrative purposes, it will be assumed that the radio frames generated by the BS 101 and by the UE 103 have the above-described frame structure.

The BB unit 101a generates the radio frames that are made up of the OFDM symbols, each of which has a plurality of beam indices associated with it. It should be noted that while the representative embodiments are being described with reference to the use of OFDM symbols, the inventive principles and concepts are not limited to the use of OFDM symbols, as will be understood by those of skill in the art in view of the description provided herein. Assuming the BS 101 has N BS antenna ports 106, where N is a positive integer that is greater than or equal to 2, N different beam indices may be allocated to the N BS antenna ports 106, respectively, during each OFDM symbol period. The BB unit 101a uses the beam indices-to-symbol mapping logic 105 to obtain the beam indices corresponding to each OFDM symbol. Each beam index allocated to each BS antenna port 106 is a number that corresponds to a vector of weights comprising one complex coefficient (an amplitude value and a phase value represented as a complex number) for each antenna element.

An RF unit 101b of the BS 101 includes a digital-to-analog converter (DAC) and IF converter block 104, N BS analog beam former circuits 107, and N BS antenna arrays 108. The N BS analog beam former circuits 107 are located at the N BS antenna ports 106, respectively. The DAC and IF converter block 104 converts digital BB signals output from the BB unit 101a, which include information from which the beam indices and the beam index sequences can be decoded, into analog IF signals. The IF signals have a known frame structure and include control information that can be extracted and decoded by the RC emulator 102 to obtain the beam indices and the corresponding beam index sequence. The beam indices or antenna element weights are typically passed to the analog beam former circuits 107 via an internal interface (not shown) of the BS 101.

The N analog beam former circuits 107 use N respective weights corresponding to the N respective beam indices to weight BS antenna elements of one of N respective BS antenna arrays 108 to cause the N respective BS antenna arrays 108 to form N time-variant or time-invariant BS antenna array beam patterns 109, respectively. In accordance with this representative embodiment, the BS antenna array beam pattern 109 that is formed at each BS antenna port 106 can be changed by the BS 101 at least once per symbol period. In accordance with this representative embodiment, at any given time instant, a BS antenna array beam pattern 109 is formed at each BS antenna port 106, and each of these beam patterns 109 can be different from all other beam patterns 109. Thus, the BS 101 uses the weights to selectively control the BS antenna array beam patterns 109 that are formed by the respective BS antenna arrays 108.

The RC emulator 102 has N RC input/output (I/O) ports 111 that are electrically coupled by respective electrical cables 112 to the N BS antenna ports 106, respectively. The RC emulator 102 has P RC I/O ports 113 that are electrically coupled by respective electrical cables 116 to a switch 117, which is electrically coupled to the probe antennas 118 of the MPAC 114. The RC emulator 102 is configured to control the switch 117 to dynamically select, during radiated testing, a particular configuration of the probe antennas 118. Alternatively, as will be described below with reference to FIG. 2, the configuration of the probe antennas 118 may be a semi-static configuration that is preselected prior to testing. In either case, the RC emulator 102 can use the switch 117 to make the selection, although the switch 117 is not always needed to make a preselection of a semi-static configuration of the probe antennas 118. In the case of dynamically selecting the configuration of the probe antennas during radiated testing, the optimal, or most suitable, probe antenna configuration is determined for each beam pattern and the switching by switch 117 is performed synchronously for each beam pattern (per OFDM symbol). In the case of using a semi-static configuration of the probe antennas 118, the configuration is preselected based at least in part on the M strongest beam or beam pairs.

It should be noted that although the switch 117 is shown in FIG. 1 as being part of the MPAC 114, it may instead be part of the RC emulator 102 or it may be a separate component interposed in between the RC emulator 102 and the MPAC 114.

The RC emulator 102 has a dynamically-variable channel model 120 that is configured to be dynamically varied in accordance with the beam indices. As will be described below with reference to FIG. 2, for the case in which the configuration of the antenna probes 118 has a preselected, semi-static configuration, the composite reference channel model is simulated prior to performing radiated testing to determine the optimum, or most suitable, configuration for the probe antennas 118, which are then positioned to achieve the optimum, or most suitable, configuration. In the embodiment represented by FIG. 1, a subset of the probe antennas 118 can be dynamically selected by the switch 117 during radiated testing as the dynamically-variable channel model 120 evolves.

The RC I/O ports 111 receive signals that are output from the respective BS antenna ports 106 and that contain information from which the beam indices and the beam index sequence can be extracted and decoded. The dynamically-variable channel model 120 is typically implemented as a combination of hardware and software and/or firmware that is executed by the RC emulator 102. For example, the RC emulator 102 typically includes one or more processors for executing computer instructions and one or more memory devices for storing computer instructions and possibly data. The dynamically-variable channel model 120 is configured to be dynamically varied in accordance with beam state information extracted from the beam indices such that the antenna array beam pattern 109 that is formed by each BS antenna array 108 is simulated by respective beam modeling logic 121 coupled to each respective RC I/O port 111. Each beam index defines a beam state and each beam state defines a particular beam pattern having a particular directionality. The beam states corresponding to the N simulated antenna array beam patterns 109 are embedded in the dynamically-variable channel model 120 of the RC emulator 102.

The RC emulator 102 also performs the typical RC emulator operations, i.e., fading operations, as the signals that are received at the RC I/O ports 111 propagate along channels of the RC emulator to the RC I/O ports 113. Thus, an electrical signal corresponding to a faded beam pattern generated by respective beam modeling logic 121 is output at each RC I/O port 113 and delivered via one of the electrical cables 116 and via the switch 117 to the MPAC 114.

The RC emulator 102 preferably is configured to sample at least one of the signals that are output from the BS antenna ports 106 and received by a respective one of the RC I/O ports 111 to perform frame and symbol synchronization to synchronize the RC emulator 102 with the BS 101. This synchronizes the beam pattern generation that is performed by the beam modeling logic 121 with the beam pattern generation that is performed by the respective BS antenna arrays 108. After performing frame and symbol synchronization, the RC emulator 102 extracts the beam state information from the signals that are output from the BS antenna ports 106 and received by the respective RC I/O ports 111. The RC emulator 102 is configured to emulate the dynamically-variable channel model 120 on one or more channels of the RC emulator 102 using the extracted beam state information and using channel model coefficients that are calculated based at least in part on the extracted beam state information.

The frame and symbol synchronization can be performed by the RC emulator 102 either once at the beginning of the test, or continuously or periodically during the test by measuring the transmission of the BS 101 or of a BS emulator (not shown) in the event that a BS emulator is used in lieu of a BS. The synchronization measurement can be performed by exploiting the known structures of the signals that are output from the BS antenna ports 106. If the BS 101 has RF connectors, the RC emulator 102 can sample and down-convert the RF signals that are output from the BS antenna ports 106 and received at each of its RC I/O ports 111, perform time and frequency synchronization and detect and decode necessary information of the signal structure to extract frame and symbol synchronization parameters. The synchronization procedure may be based on algorithms similar to those used by typical UE (e.g., a mobile phone) in communication with a BS to perform synchronization, which is typically based on decoding Primary Synchronization Signal (PSS), Secondary Synchronization Signal (SSS) and/or exploiting a known pilot sequence transmitted on each BS transmit antenna port.

Alternatively, if decoding of beam state information in the RC emulator 102 is not necessary, it is possible to synchronize via trigger from the BS 101 or from a BS emulator. The beam state information is used to apply the beam states during the RC emulation operations that are performed by the RC emulator 102. For each time instant, the BS 101 and the UE 103 each have an active beam index that defines a respective beam state. This pair of active beam indexes is referred to herein as Tx/Rx beam index pair. In some cases, the dynamically-variable channel model 120 of the RC emulator 102 models both the antenna array beam patterns 109 generated by the BS 101 and antenna array beam patterns 129 generated by the UE 103. In such cases, the terms "beam state" or "beam state information" correspond to active beam indexes of the BS 101 and to active beam indexes of the UE 103. In such cases, the beam states are defined by Tx/Rx beam index pairs, which are embedded by the RC channel emulator 102 in the dynamically-variable channel model 120. In some cases, the dynamically-variable channel model 120 of the RC emulator 102 models either the antenna array beam patterns 109 or the antenna array beam patterns 129, but not both. In those cases, the terms "beam state" or "beam state information" correspond to active beam indexes of the BS 101 or to active beam indexes of the UE 103, depending on whether the antenna array beam patterns 109 or the antenna array beam patterns 129 are being modeled in the RC emulator 102.

Beam state sequences can be fixed and pre-configured in advance in the RC emulator 102 in some cases. In such cases, the beam state information can be exploited in advance during the channel model/emulation generation phase. The dynamically-variable channel model 120 is built prior to running the emulation in the RC emulator 102. File-based systems and channel modelling tools are available that can be used to build the channel model 120 and to write the channel model coefficients into one or more files. The RC emulator 102 then "plays" these files back when executing the emulation. If the beam state sequences are known in advance, it is relatively easy to generate the channel model 120 and write it into the corresponding file(s), but it is not very easy to play the files back in the RC emulator 102 due to the high update rate requirement. Therefore, multiple options are described below for executing the dynamically-variable channel model 120 in a file-based RC emulator 102.

If the beam state sequences are not fixed and pre-configured in advance, the beam state sequences can be dynamically scheduled by detecting and decoding downlink control information (DCI) or other control information contained in the signals that are received at the RC I/O ports 111 from the BS antenna ports 106. In normal downlink signaling, the signals that are output from the BS 101 include beam state information that can be decoded by the RC emulator 102 and by the UE 103. The DCI or other control information contains the beam index-to-symbol index mapping information, which can be detected and decoded to obtain the beam state scheduling information. The beam state scheduling information is typically signaled one to twenty subframes in advance of the corresponding beam states, and thus decoding is performed almost in real time.

Another way to dynamically schedule a beam state sequence is to provide a separate communication interface between the BS 101 or BS emulator and the RC emulator 102 over which beam state sequence information is signaled. The communication interface may be, for example, a digital communication interface comprising a fast serial link over which signals that include synchronization and timing information are sent from the BS 101 or BS emulator to the RC emulator 102. A similar communication interface can be provided between the RC emulator 102 and the UE 103.

With reference to the UE 103, BB and IF circuitry 124 of the UE 103 generates radio frames that are made up of symbols, which, for exemplary purposes are assumed to be OFDM symbols. The BB and IF circuitry 124 includes beam indices-to-symbol mapping logic 125 that maps beam indices to symbols within each radio frame. The radio frames are made up of the symbols, each of which has a plurality of beam indices associated with it. In accordance with a representative embodiment, Q different beam indices can be allocated to Q respective UE antenna ports 115 four times during each symbol period, where Q is a positive integer that is greater than or equal to 2. The BB and IF circuitry 124 uses the beam indices-to-symbol mapping logic 125 to obtain the beam indices corresponding to each symbol. Each beam index allocated to each respective UE antenna port 115 is a number that corresponds to a vector of weights comprising one complex coefficient (a phase value and an amplitude value represented as a complex number) for each antenna element. The UE 103 has Q UE analog beam former circuits 127 located at the Q UE antenna ports 115, respectively, that use Q respective weights associated with the Q respective beam indices to weight UE antenna elements of one of Q respective UE antenna arrays 128 to cause the Q respective UE antenna arrays 128 to form Q respective UE antenna ray beam patterns 129.

In accordance with this representative embodiment, the UE antenna array beam pattern 129 that is formed at each UE antenna port 115 can be changed by the UE 103 at least four times per symbol period. At any given time instant, a beam pattern 129 can be formed at each UE antenna port 115, and each of these beam patterns 129 can be different from all of the other beam patterns 129. Thus, the UE 103 uses the weights to selectively control the UE antenna array beam patterns 129 that are formed by the respective UE antenna arrays 128.

When the UE 103 is transmitting, the RC emulator 102 samples at least one of the signals that are received by a respective one of the RC I/O ports 113 from at least one of the probe antennas 118 to perform frame and symbol synchronization to synchronize the RC emulator 102 with the UE 103. This is performed to synchronize the beam pattern generation that is performed by the beam modeling logic 121 with the beam pattern generation that is performed by the respective mobile device antenna arrays 128. All of the options described above for performing frame and symbol synchronization between the BS 101 and the RC emulator 102 may also be used to perform frame and symbol synchronization between the UE 103 and the RC emulator 102.

After performing frame and symbol synchronization, the RC emulator 102 extracts beam state information from the signals that are received at the RC I/O ports 113 from the probe antennas 118. The RC emulator 102 is configured to emulate the dynamically-variable channel model 120 on one or more channels of the RC emulator 102 using the extracted beam state information and using channel model coefficients that are calculated based at least in part on the extracted beam state information.

In the representative embodiment described above with reference to FIG. 1, although the selection of the antenna probes 118 is performed dynamically during testing, it is possible to make a preselection of the antenna probes 118 that will be used during testing. For example, the preselection may be some subset of the full array of the antenna probes 118 (e.g., antenna probes 118 at particular locations). As another example, the preselection of the number and location of the antenna probes 118 may be performed as a step in designing the MPAC 114 to reduce the overall number of antenna probes 118 that are used in the chamber 114 while optimizing the locations of the antenna probes 118 within the MPAC 114. During testing, the preselected configuration of the antenna probes 118 is dynamically configured (e.g., activated, deactivated) by the RC emulator 102 using the switch 117. For this type of preselection, when the UE 103 is the DUT, the M strongest BS antenna array beam patterns 109 or the M strongest BS, UE antenna beam pattern pairs (if the UE antenna characteristics are known) are determined from a simulation of the channel model 120 and used to preselect the configuration (e.g., the subset) of the probe antennas 118 that will subsequently be dynamically configured (e.g., activated, deactivated, weighted, etc.) during testing. Similarly, for this type of preselection when the BS 101 is the DUT, the M strongest UE antenna array beam patterns 129 or the M strongest BS, UE antenna array beam pattern pairs 109, 129 (if the antenna characteristics of the DUT are known) are determined during a beam power simulation of the channel model 120 and used to preselect a configuration of the probe antennas 118 that will subsequently be dynamically configured (e.g., activated, deactivated, weighted, etc.) during testing.

Figure 2:
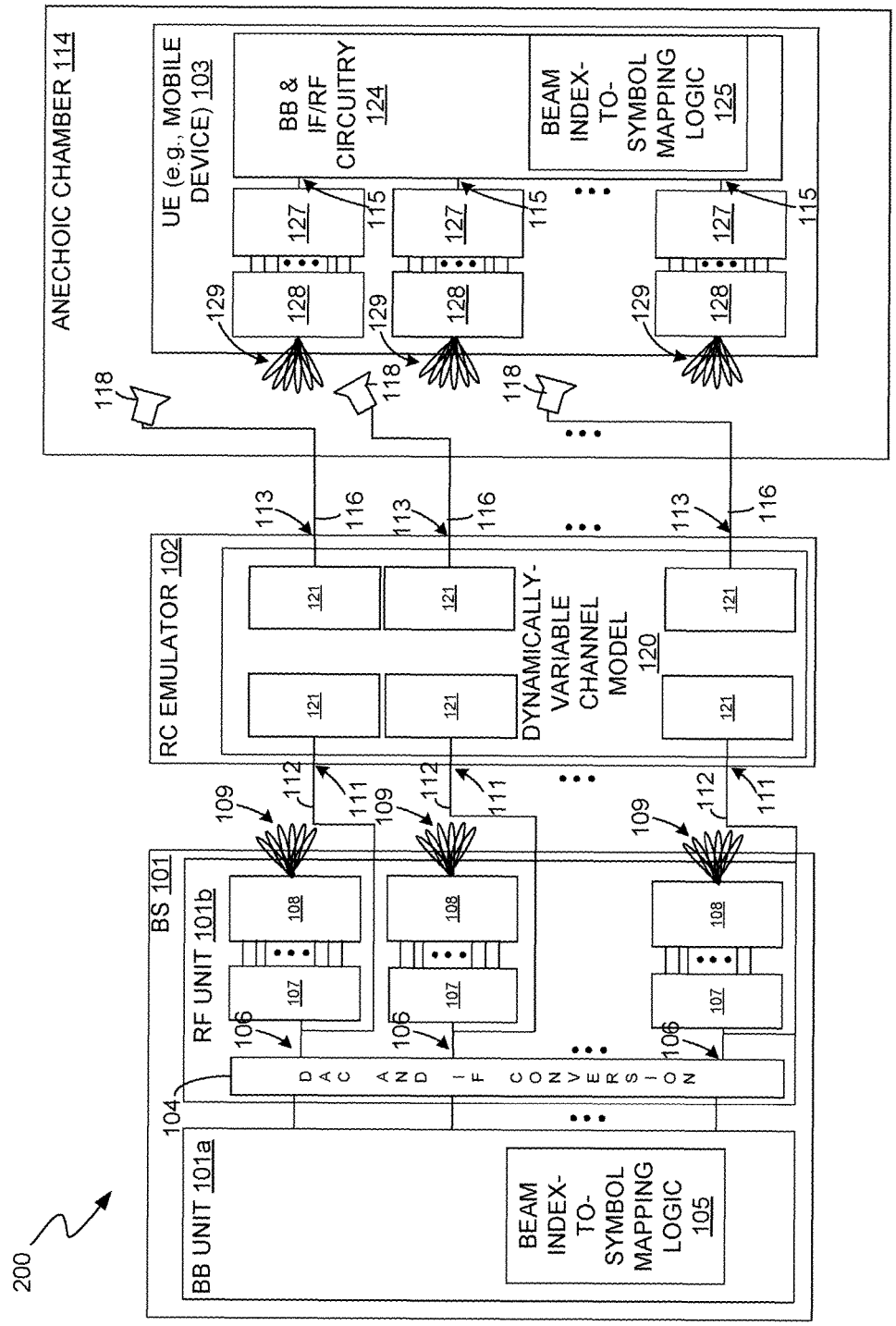
FIG. 2 is a schematic block diagram of an MPAC OTA test system in accordance with a representative embodiment that is suitable for testing a 5G DUT and that has an antenna probe configuration that is preselected and fixed based at least in part on a particular channel model of the RC emulator.

FIG. 2 is a schematic block diagram of an MPAC OTA test system 200 in accordance with a representative embodiment that is suitable for testing a 5G DUT and that has a semi-static configuration of the antenna probes 118 that is preselected. As indicated above, the preselection is based at least in part on a determination of the M strongest beam patterns or beam pattern pairs, depending on whether the reference channel model takes into account beam patterns of the DUT or only beam patterns generated by the device at the opposite end of the link from the DUT. A composite reference channel model of the M strongest antenna array beam patterns or beam pattern pairs is constructed and a probe antenna configuration that is optimized for the composite reference channel model is preselected.

The MPAC OTA system 200 shown in FIG. 2 is identical to the MPAC OTA test system 100 shown in FIG. 1 except that the test system 200 does not include the switch 117 shown in FIG. 1. The preselected configuration of the antenna probes 118 is set by choosing the total number of probe antennas 118 to be used in the MPAC 114 and positioning the probe antenna 118 within the MPAC 114. During radiated testing, the dynamically-variable channel model 120 models the N BS antenna array beam patterns 109. The probe antenna weighting is performed dynamically by the RC emulator 102.

Figure 3:
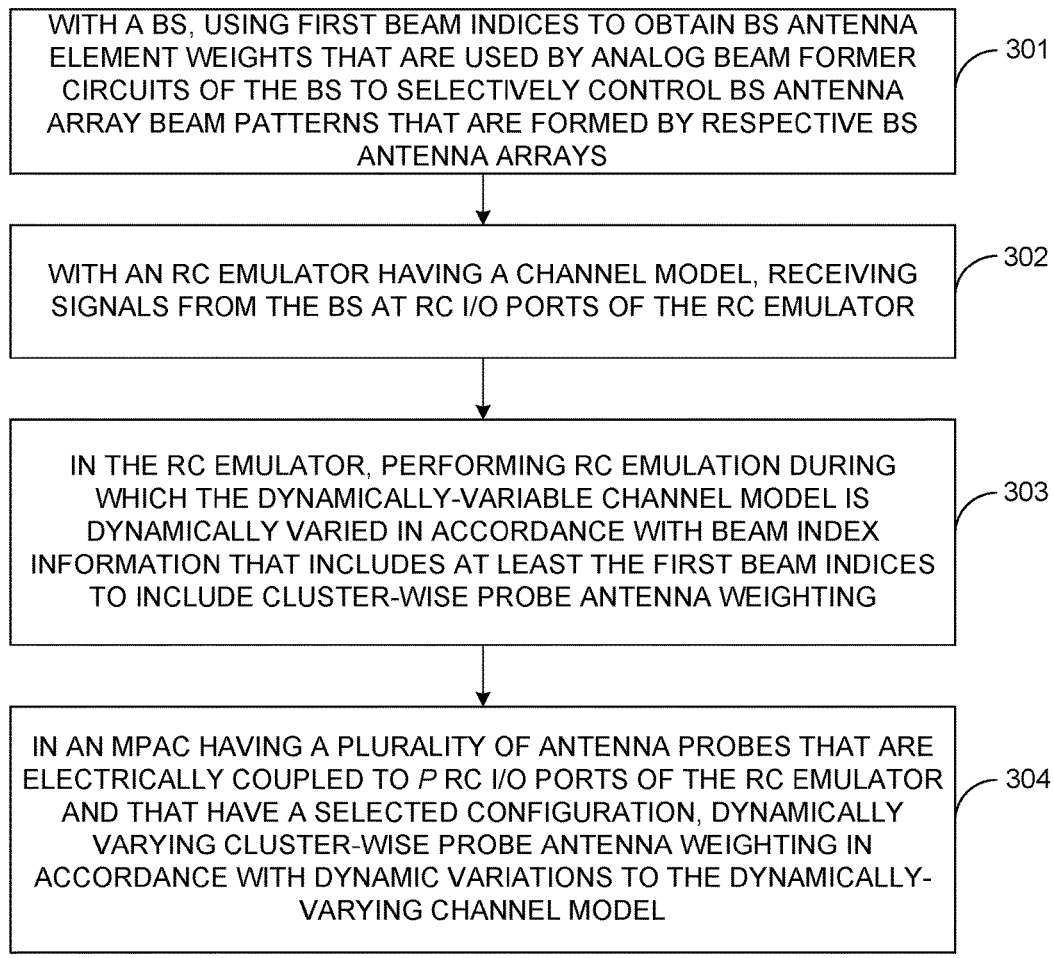
FIG. 3 is a flow diagram representing the radiated test method in accordance with a representative embodiment in which the UE is the DUT and the radiated test method is being used to test the UE.

FIG. 3 is a flow diagram representing the method of performing radiated testing on the UE 103, i.e., the UE 103 is the DUT, in accordance with a representative embodiment. The method will be described with reference to components shown in the systems 100 and 200, but it should be noted that the method is not limited to the system configurations shown in FIGS. 1 and 2, as will be understood by those of skill in the art in view of the description provided herein. For example, FIGS. 1 and 2 depict a 5G BS 101 and a 5G UE 103, but the inventive principles and concepts apply to BSs and UE that are not 5G BSs and UE.

The BS 101 uses first beam indices to obtain BS antenna element weights that are used by the analog beam former circuits 107 to selectively control BS antenna array beam patterns 109 that are formed by the respective BS antenna arrays 108, as indicated by block 301. With the RC emulator 102 having the dynamically-variable channel model 120, the signals that are output from the BS 101 are received at the RC I/O ports 111, as indicated by block 302. In the RC emulator 102, RC emulation is performed during which the dynamically-variable channel model 120 is dynamically varied in accordance with beam index information to include cluster-wise probe antenna weighting as indicated by block 303. The beam index information includes at least the first beam indices. In the MPAC 114 having the plurality of antenna probes 118 that are electrically coupled to P RC I/O ports of the RC emulator 102 and that have a selected configuration, dynamically varying cluster-wise weighting of the antenna probes in accordance with dynamic variations to the dynamically-variable channel model 120, as indicated by block 304.

Figure 4:
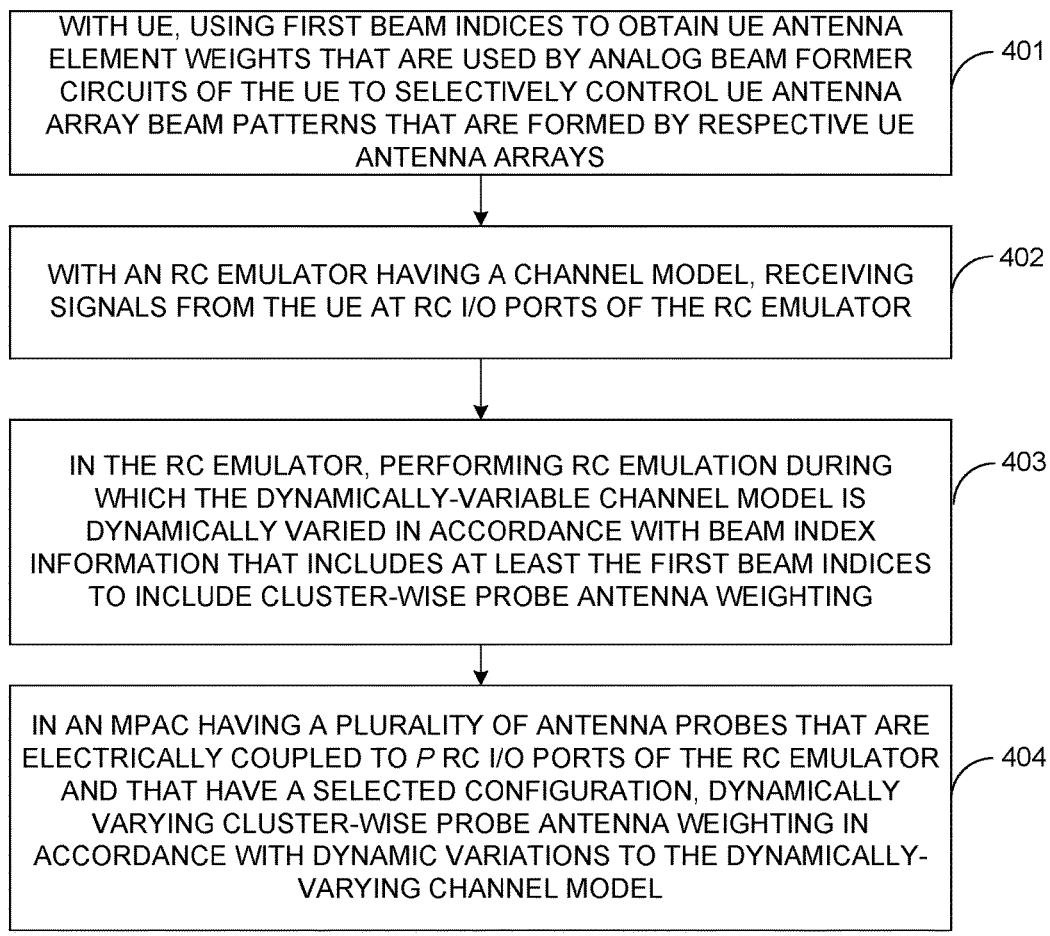
FIG. 4 is a flow diagram representing the radiated test method in accordance with a representative embodiment in which the BS is the DUT and the radiated test method is being used to test the BS.

FIG. 4 is a flow diagram representing the method of performing radiated testing on the BS 101, i.e., the BS 101 is the DUT, in accordance with a representative embodiment. The method will be described with reference to components shown in the systems 100 and 200, but it should be noted that the method is not limited to the system configurations shown in FIGS. 1 and 2, as will be understood by those of skill in the art in view of the description provided herein.

The UE 103 uses first beam indices to obtain UE antenna element weights that are used by the analog beam former circuits 127 to selectively control UE antenna array beam patterns 129 that are formed by the respective UE antenna arrays 128, as indicated by block 401. In accordance with this embodiment, the positions of the BS 101 and the UE 103 are switched such that the BS 101 is disposed inside of the MPAC 114. With the RC emulator 102 having the channel model 120, the signals that are output from the UE 103 are received at the RC I/O ports 111, as indicated by block 402. In the RC emulator 102, RC emulation is performed during which the dynamically-variable channel model 120 is dynamically varied in accordance with beam index information to include cluster-wise probe antenna weighting, as indicated by block 403. The beam index information includes at least the first beam indices. In the MPAC 114 having the plurality of antenna probes 118 that are electrically coupled to the P RC I/O ports 113 of the RC emulator 102 and that have a selected configuration, dynamically varying cluster-wise weighting of the antenna probes in accordance with dynamic variations to the dynamically-variable channel model 120.

Current channel modeling principles commonly used in 3GPP-specified channel models (e.g., TR.38.901 or TR.36.873) apply antenna responses for each ray of each cluster and the cluster and ray angles to generate time-invariant antenna array beam patterns. In accordance with a representative embodiment, in the dynamically-variable channel model 120, discrete time-variant antenna beam patterns are substituted for the time-invariant antenna beam patterns of the 3GPP-specified channel model as follows:

$$\begin{cases} \begin{bmatrix} F_{rx,u,\theta}(\theta_{n,m,ZOA}, \phi_{n,m,AOA}) \\ F_{rx,u,\phi}(\theta_{n,m,ZOA}, \phi_{n,m,AOA}) \end{bmatrix} \rightarrow \begin{bmatrix} F_{rx,\zeta,b_i,\theta}(\theta_{n,m,ZOA}, \phi_{n,m,AOA}, t) \\ F_{rx,\zeta,b_i,\phi}(\theta_{n,m,ZOA}, \phi_{n,m,AOA}, t) \end{bmatrix} \\ \begin{bmatrix} F_{tx,s,\theta}(\theta_{n,m,ZOD}, \phi_{n,m,AOD}) \\ F_{tx,s,\phi}(\theta_{n,m,ZOD}, \phi_{n,m,AOD}) \end{bmatrix} \rightarrow \begin{bmatrix} F_{tx,\xi,\beta_i,\theta}(\theta_{n,m,ZOD}, \phi_{n,m,AOD}, t) \\ F_{tx,\xi,\beta_i,\phi}(\theta_{n,m,ZOD}, \phi_{n,m,AOD}, t) \end{bmatrix} \end{cases},$$

where t is time, $b_i \in \{1, \ldots, B_{rx}\}$ and $B_i \in \{1, \ldots, B_{tx}\}$ refer to receiver (Rx) and transmitter (Tx) beam patterns, respectively, within sub-sets B of fixed beam patterns, $\zeta$ and $\xi$ denote the index of the antenna ports 106 and 115 of Rx and Tx beams, respectively, where a discrete time index $$i = \left\lfloor \frac{t}{T_s} \right\rfloor \in N,$$

where $T_s$ is the discrete time step between the beam state updates, and where ⌊ ⌋ denotes a round down (floor) operator; a different beam state may be defined for each discrete time step i or the same beam state may be repeated multiple times depending on the configuration of the test system 100; $F_{rx,u,\theta}$ and $F_{rx},u,\phi$ are the complex antenna gains of Rx antenna u for polarizations θ and Φ, respectively; $F_{tx,s,\theta}$ and $F_{tx,s,\phi}$ are the complex antenna gains of Tx antenna s for polarizations θ and Φ, respectively; $F_{rx,\zeta,b_i,\theta}$ and $F_{rx,\zeta,b_i,\phi}$ are the complex beam gains of Rx beam number $b_i$ of Rx antenna port $\zeta$ for polarizations θ and Φ, respectively; the complex beam gain may be referred to as a beam pattern or beam state and it is a result of calculating the response of an antenna array with weighting coefficients according to a particular beam index; $F_{tx,\xi,\beta_i,\theta}$ and $F_{tx,\xi,\beta_i,\phi}$ are the complex beam gains of Tx beam number $\beta_i$ of Tx antenna port $\xi$ for polarizations θ and Φ, respectively; the complex beam gain may be referred to as a beam pattern or beam state and it is a result of calculating the response of an antenna array with weighting coefficients according to a particular beam index; n and m denote the cluster (propagation path) and the sub-path (ray) indices defined in the geometry-based stochastic channel model; $\theta_{n,m,ZOA}$ and $\phi_{n,m,AOA}$ are the zenith and azimuth angles of arrival of the nth cluster and mth sub-path, respectively; and $\theta_{n,m,ZOD}$ and $\phi_{n,m,AOD}$ are the zenith and azimuth angles of departure of nth cluster and mth sub-path, respectively.

It should be noted that in commonly-known channel modeling terminology, the BS is always defined with transmitter parameters and the UE is always defined with receiver parameters. Thus, if the BS is the DUT, the Rx-antenna patterns are be embedded in the dynamically-variable channel model 120 and if the UE is the DUT, the Tx-antenna patterns are embedded in the dynamically-variable channel model 120.

If the RC emulator 102 is a non-file based RC emulator, the channel coefficients for the dynamically-variable channel model 120 are generated on the fly. The beam states can be updated by applying beam state-specific coefficients for each sinusoid during calculation of the channel coefficients. If the RC emulator 102 is a file-based channel emulator, the channel coefficients are generated prior to RC emulation and stored in files inside of the RC emulator 102 that are executed by the RC emulator 102 during RC emulation.

The dynamically-variable channel model 120 can be generated for each pre-defined beam state and beam-specific channel models can run in parallel in the beam modeling logic 121 of the RC emulator 102. One of the parallel channel models can be activated per time instant according to active beam state information. The parallel channel models may run on multiple physical channels of the RC emulator 102 or on a single physical channel by defining individual sets of clusters/taps for each beam pattern (i.e., multiple overlapping taps). In the case of running the model 120 on multiple physical channels of the RC emulator 102, the beam pattern selection is typically performed by activating one channel at each time instant with a switching mechanism (not shown). The switching can be performed by, for example, a BS emulator if the number of BS emulator output ports is higher than the number of antenna ports required in the test system 100. In the case of running the model 120 on a single physical channel of the RC emulator 102, beam pattern selection is performed by enabling a channel or a set of taps assigned for a given beam pattern while channels or taps assigned for other beam patterns are disabled by, for example, setting those channels to have high attenuation.

The parallel execution of multiple beam patterns generally requires the use of additional channel or tap resources in the RC emulator 102. The parallel resource usage may, however, be reduced by, for example, running a single beam model and updating the amplitudes and phases of each tap/cluster based on the selected beam pattern.

There are multiple options for running the time-variant or time-invariant beam patterns sequentially in the RC emulator 102. A first option is a full-embedding option that involves generating channel model coefficients for all beam pattern combinations in advance. The term "full embedding," as that term is used herein, means that all relevant antenna array characteristics are fully included in the dynamically-variable channel model 120. The term "partial-embedding," as that term is used herein, means that the dynamically-variable channel model 120 is an approximation of the antenna array characteristics that does not yet include all possible effects of the antenna array beam patterns.

For the first full-embedding option, each Tx/Rx beam index pair has a plurality (e.g., twenty-four) fading taps associated with it that will be activated in the RC emulator 102 based on beam indices received in the RC emulator 102. The channel model of each Tx/Rx beam index pair will be stored in memory of the beam modeling logic 121 and selected for execution according to the Tx/Rx beam index pair that is active at each time instant. Also in this case, multiple beam patterns may run in parallel, with a single beam pattern being active at a given time instant to enable fast transition between active beam patterns.

A second full-embedding option for running the time-variant beam patterns sequentially in the RC emulator 102 involves calculating, in advance, a table of complex scaling coefficients and Doppler phasor scaling coefficients per Tx/Rx beam index pair for each tap, running a single set of tap coefficients and updating tap gain, phase scaler and Doppler phasor scaler coefficients based on the beam indices received in the RC emulator 102.

A first partial-embedding option for running the time-variant beam patterns sequentially in the RC emulator 102 involves calculating, in advance, a table of gain scaling coefficients for each Tx/Rx beam index pair for each tap, running a single set of tap coefficients and updating only tap gain scaler coefficients based on the beam index received in the RC emulator 102. This option is particularly well suited for cases in which intra-cluster angle spreads are small. The tap gain scaler coefficients should also be time-variant (i.e., slowly changing) in the case of a dynamic model with cluster angle/antenna orientation evolution. This option neglects Doppler phasor changes and inter-port phase differences due to analog beam pattern differences. Antenna array geometry-based phase differences are included and there is no error in inter-port phase difference if the beam patterns of each antenna port are similar. Phase differences among ports are not expected to be relevant if the analog beam patterns per port are different.

A second partial-embedding option for running the time-variant beam patterns sequentially in the RC emulator 102 involves calculating, in advance, a table of complex scaling coefficients for each beam index pair for each tap, running a single set of tap coefficients and updating only tap gain and phase scaler coefficients based on the beam indices received in the RC emulator 102.

Figure 5:
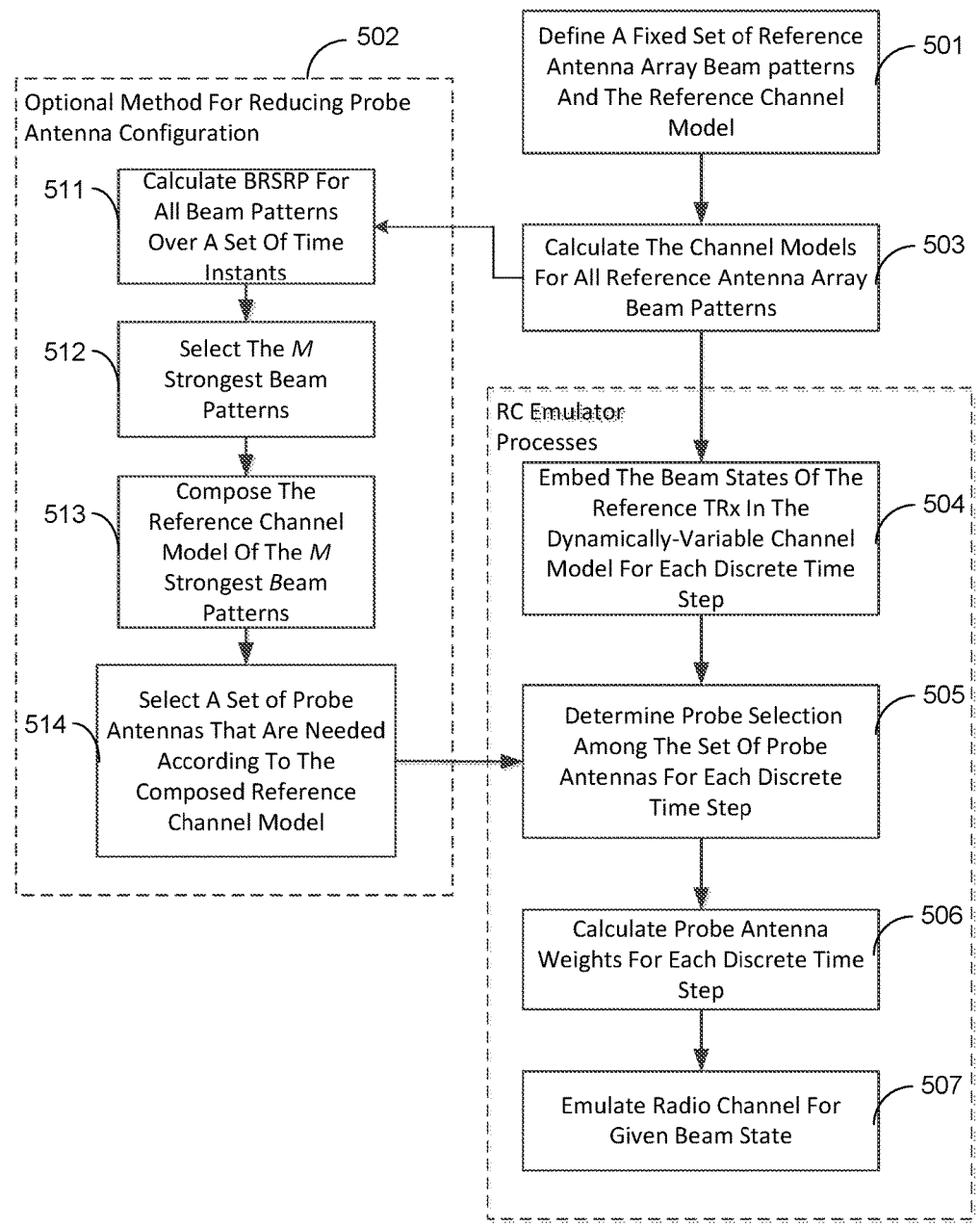
FIG. 5 is a flow diagram representing the method for performing radiated testing for the case in which the configuration of the probe antennas is selected based only on the reference channel model.

FIG. 5 is a flow diagram representing the method for performing radiated testing for the case in which the configuration of the probe antennas 118 is selected based only on the reference channel model. The term "reference channel model," as used herein, denotes the channel model that includes the antenna array beam patterns of the device disposed at the opposite end of the link from the DUT. Therefore, if the BS is the DUT, the reference channel model is a channel model that includes the UE antenna array beam patterns 129, whereas if the UE is the DUT, the reference channel model is a channel model that includes the BS antenna array beam patterns 109. The term "reference antenna array beam patterns," as used herein, denotes the antenna array beam patterns generated by the reference TRx, which is the BS 101 if the UE 103 is the DUT and which is the UE 103 if the BS 101 is the DUT.

Block 501 represents the process of defining a fixed set of reference antenna array beam patterns and constructing the reference channel model of the fixed set of reference antenna array beam patterns. Block 502 represents an optional method for reducing the number of probe antennas 118 that are used in the MPAC 114 by optimizing the configuration of probe antennas 118 based on the M strongest reference antenna array beam patterns, as determined via the aforementioned simulation. If the process represented by block 502 is bypassed, the process proceeds to block 503 at which the channel models for all of the reference antenna array beam patterns are calculated. The process then proceeds to block 504 at which the beam states associated with the reference antenna array beam patterns defined at block 501 are embedded in the dynamically-variable channel model 120 for each discrete time step. The process then proceeds to block 505 at which the configuration of the antenna probes 118 is dynamically selected in the manner described above with reference to FIG. 1. At the step represented by block 506, the weights for the probe antenna 118 are calculated for each discrete time step and included into channel model. Block 507 represents the step of performing RC emulation.

With reference to block 511, the BRSRP is calculated for all of the reference antenna array beam patterns defined at block 501 over a set of time instants. The M strongest reference antenna array beam patterns are selected at block 512. The reference channel model composed of the M strongest reference antenna array beam patterns is simulated, as indicated by block 513. The composed reference channel model can be calculated, for example, by calculating a sum radiation pattern of the selected M beam patterns and embedding the sum radiation pattern into channel model. The set of probe antennas 118 that are needed for radiated testing is then selected based on the composed reference channel model, as indicated by block 514. When the option represented by block 502 is used, the set of probe antennas 118 selected at block 514 is used at block 505 to dynamically select a subset of the probe antennas 118 for each beam state to be used during the radiated test.

Some or all of the steps represented by blocks 511-514 may be performed in the RC emulator 102, such as the aforementioned simulation, or they may be performed in a computational device that is external to the RC emulator 102.

Figure 6:
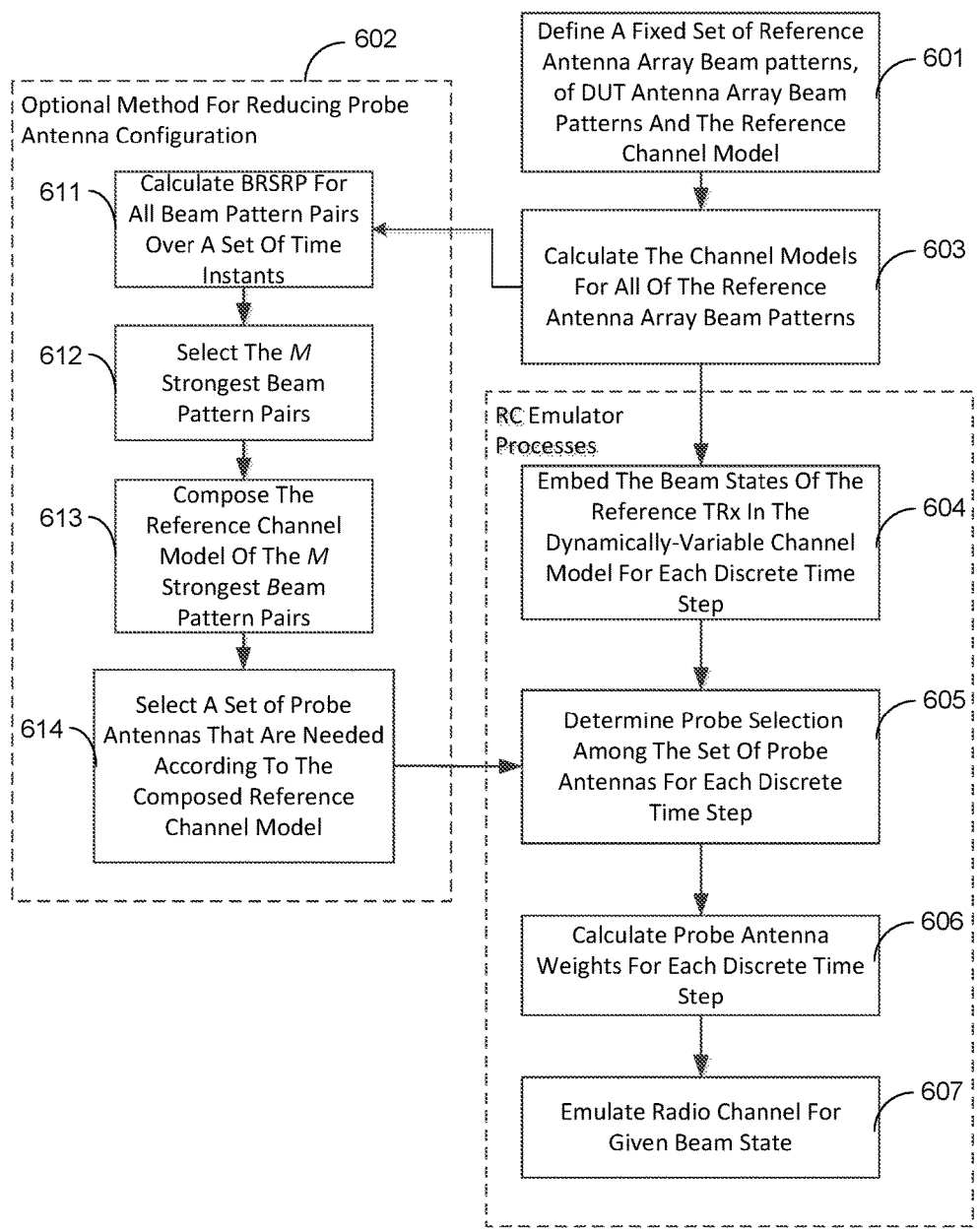
FIG. 6 is a flow diagram representing the method for performing radiated testing for the case in which the configuration of the probe antennas is selected based on the reference channel model and on the DUT.

FIG. 6 is a flow diagram representing the method for performing radiated testing for the case in which the configuration of the probe antennas 118 is selected based on the reference channel model and on the DUT. Block 601 represents the process of defining a fixed set of reference antenna array beam patterns and constructing the reference channel model of the fixed set of reference antenna array beam patterns. Block 602 represents an optional method for reducing the number of probe antennas 118 that are used in the MPAC 114 by optimizing the configuration of probe antennas 118 based on the M strongest pairs of the reference antenna array beam patterns and the DUT antenna array beam patterns, as determined via the aforementioned simulation. If the process represented by block 602 is bypassed, the process proceeds to block 603 at which the channel models for all of the reference antenna array beam patterns are calculated. The process then proceeds to block 604 at which the beam states associated with the reference antenna array beam patterns defined at block 501 are embedded in the dynamically-variable channel model 120 for each discrete time step. The process then proceeds to block 605 at which the configuration of the antenna probes 118 is dynamically selected in the manner described above with reference to FIG. 1. At the step represented by block 606, the weights for the probe antenna 118 are calculated for each discrete time step and included into channel model. Block 607 represents the step of performing RC emulation.

With reference to block 611, the BRSRP is calculated for all of the reference and DUT antenna array beam pattern pairs defined at block 601 over a set of time instants. The M strongest reference and DUT antenna array beam pattern pairs are selected at block 612. The reference channel model composed of the M strongest reference and DUT antenna array beam pattern pairs is simulated, as indicated by block 613, and the set of probe antennas 118 that are needed for radiated testing is selected based on the composed model, as indicated by block 614. When the option represented by block 602 is used, the set of probe antennas 118 selected at block 614 is used at block 604 to dynamically select a subset of the probe antennas 118 to be used during the radiated test.

It should be noted that while the representative embodiments described above show the BS antenna ports 106 and the MPAC 114 connected to the RC emulator 102 via electrical cables 112 and 116, respectively, either of these cabled connections can be replaced with wireless connections, e.g., wireless cable connectivity.

It should be noted that the inventive principles and concepts have been described with reference to representative embodiments, but that the inventive principles and concepts are not limited to the representative embodiments described herein. Although the inventive principles and concepts have been illustrated and described in detail in the drawings and in the foregoing description, such illustration and description are to be considered illustrative or exemplary and not restrictive; the invention is not limited to the disclosed embodiments. Other variations to the disclosed embodiments can be understood and effected by those skilled in the art, from a study of the drawings, the disclosure, and the appended claims.

What is claimed is:

1. A multi-probe anechoic chamber (MPAC) over-the-air (OTA) test system for performing radiated testing of a user equipment (UE) device under test (DUT) disposed inside of the MPAC, the test system comprising:
   a base station (BS) configured to selectively control BS antenna elements electrically coupled to N BS antenna ports in accordance with first beam indices, where N is a positive integer that is greater than or equal to two, each of N BS antenna arrays of the BS comprising a plurality of the BS antenna elements, an analog beam former circuit of the BS weighting the BS antenna elements based on the first beam indices to cause N BS antenna array beam patterns to be formed by the N BS antenna arrays, respectively;
   a radio channel (RC) emulator having at least N RC input/output (I/O) ports electrically coupled to the N BS antenna ports, respectively, and having P RC I/O ports, where P is a positive integer that is greater than or equal to two, the RC emulator having a dynamically-variable channel model that is dynamically varied by the RC emulator during RC emulation in accordance with beam index information to include cluster-wise probe antenna weighting, the beam index information including at least the first beam indices; and
   an MPAC having a plurality of antenna probes that are electrically coupled to the P RC I/O ports and that are in a selected configuration, and wherein cluster-wise weighting of the probe antennas is dynamically varied in accordance with dynamic variations to the dynamically-varying channel model.

2. The MPAC OTA test system of claim 1, wherein the UE has Q UE antenna arrays capable of generating Q UE antenna array beam patterns, respectively, and wherein the selection of the configuration of the probe antennas is a preselection made prior to testing based on a determination made during a beam power simulation of which pairs of the N BS antenna array beam patterns and of the Q UE antenna array beam patterns are the M strongest pairs of the N BS antenna array beam patterns and Q UE antenna array beam patterns, where M is a positive integer that is less than N.

3. The MPAC OTA test system of claim 1, wherein the selection of the configuration of the probe antennas is a preselection made prior to testing based on a determination made during a beam power simulation of which of the N BS antenna array beam patterns are the M strongest BS antenna array beam patterns, where M is a positive integer that is less than N.

4. The MPAC OTA test system of claim 1, further comprising:
a switch that is electrically coupled to the P RC I/O ports and to the antenna probes, and wherein the selected configuration of antenna probes comprises a subset of the antenna probes that are dynamically selected and activated by the RC emulator via the switch based at least in part on a determination made by the MPAC OTA test system of a power azimuth spectrum (PAS) of a current BS antenna array beam pattern at the DUT.

5. The MPAC OTA test system of claim 4, wherein the switch is part of the RC emulator.

6. The MPAC OTA test system of claim 4, wherein the switch is part of the MPAC.

7. The MPAC OTA test system of claim 4, wherein the switch is interposed between the RC emulator and the MPAC.

8. A multi-probe anechoic chamber (MPAC) over-the-air (OTA) test system for performing radiated testing of a base station (BS) device under test (DUT) disposed in the MPAC, the test system comprising:
user equipment (UE) configured to selectively control UE antenna elements electrically coupled to Q UE antenna ports in accordance with first beam indices, where Q is a positive integer that is greater than or equal to two, each of Q UE antenna arrays of the BS comprising a plurality of the UE antenna elements, an analog beam former circuit of the UE weighting the UE antenna elements in accordance with the first beam indices to cause Q UE antenna array beam patterns to be formed by the Q UE antenna arrays, respectively;
a radio channel (RC) emulator having at least Q RC input/output (I/O) ports electrically coupled to the Q UE antenna ports, respectively, and having P RC I/O ports, where P is a positive integer that is greater than or equal to two, the RC emulator having a dynamically-variable channel model that is dynamically varied by the RC emulator during RC emulation in accordance with beam index information to include cluster-wise probe antenna weighting, the beam index information including at least the first beam indices; and
an MPAC having a plurality of antenna probes that are electrically coupled to the P RC I/O ports and that are in a selected configuration, and wherein cluster-wise weighting of the probe antennas is dynamically varied in accordance with dynamic variations to the dynamically-varying channel model.

9. The MPAC OTA test system of claim 8, wherein the BS DUT has N BS antenna arrays capable of generating N BS antenna array beam patterns, respectively, and wherein the selection of the configuration of the probe antennas is a preselection made prior to testing based on a determination made by the RC emulator during a beam power simulation of which pairs of the N BS antenna array beam patterns and the Q UE antenna array beam patterns are the M strongest pairs of the N BS antenna array beam patterns and Q UE antenna array beam patterns, where M is a positive integer that is less than N.

10. The MPAC OTA test system of claim 8, wherein the selection of the configuration of the probe antennas is a preselection made prior to testing based on a determination made by the RC emulator during a beam power simulation of which of the Q UE antenna array beam patterns are the M strongest UE antenna array beam patterns, where M is a positive integer that is less than Q.

11. The MPAC OTA test system of claim 8, further comprising:
a switch that is electrically coupled to the P RC I/O ports and to the antenna probes, and wherein the selected configuration of antenna probes comprises a subset of the antenna probes that are dynamically selected and activated by the RC emulator via the switch based at least in part on a determination made by the MPAC OTA test system of a power azimuth spectrum (PAS) of a current UE antenna array beam pattern at the DUT.

12. The MPAC OTA test system of claim 11, wherein the switch is part of the RC emulator.

13. The MPAC OTA test system of claim 11, wherein the switch is part of the MPAC.

14. The MPAC OTA test system of claim 11, wherein the switch is interposed between the RC emulator and the MPAC.

15. A method for use in a multi-probe anechoic chamber (MPAC) over-the-air (OTA) test system for performing radiated testing of a user equipment (UE) device under test (DUT) disposed in the MPAC, the test system comprising:
with an analog beam former circuit of a base station (BS), weighting BS antenna elements in accordance with first beam indices to cause N BS antenna array beam patterns to be formed by N BS antenna arrays, respectively, of the BS, where N is a positive integer that is greater than or equal to two, each of the N BS antenna arrays comprising a plurality of the BS antenna elements;
with a radio channel (RC) emulator having at least N RC input/output (I/O) ports electrically coupled to the N BS antenna ports, respectively, and having P RC I/O ports, where P is a positive integer that is greater than or equal to two, performing RC emulation during which a dynamically-variable channel model of the RC emulator is dynamically varied by the RC emulator in accordance with beam index information to include cluster-wise probe antenna weighting, the beam index information including at least the first beam indices; and
in an MPAC having a plurality of antenna probes that are electrically coupled to the P RC I/O ports and that are in a selected configuration, dynamically varying cluster-wise weighting of the probe antennas in accordance with dynamic variations to the dynamically-varying channel model.

16. The method of claim 15, wherein the UE has Q UE antenna arrays capable of generating Q UE antenna array beam patterns, respectively, and wherein the selected configuration of the probe antennas is a preselected configuration made prior to testing, the method further comprising:
prior to performing radiated testing, preselecting the configuration of the probe antennas based on a determination by the RC emulator during a beam power simulation of which pairs of the N BS antenna array beam patterns and the Q UE antenna array beam patterns are the M strongest pairs of the N BS antenna array beam patterns and Q UE antenna array beam patterns, where M is a positive integer that is less than N.

17. The method of claim 15, wherein the selected configuration of the probe antennas is a preselection made prior to testing, the method further comprising:

prior to performing radiated testing, preselecting the configuration of the probe antennas based on a determination made by the RC emulator during a beam power simulation of which of the N BS antenna array beam patterns are the M strongest BS antenna array beam patterns, where M is a positive integer that is less than N.

18. The method of claim 15, wherein the cluster-wise probe antenna weighting is dynamically updated within the dynamically-variable channel model in accordance with the beam index information.

19. The method of claim 15, wherein the selected configuration of the probe antennas is a dynamically-selected configuration made while performing radiated testing, the method further comprising:

with the RC emulator, using a switch that is electrically coupled to the P RC I/O ports and to the antenna probes to dynamically select the configuration of probe antennas to be used during radiated testing.

20. A method for use in a multi-probe anechoic chamber (MPAC) over-the-air (OTA) test system for performing radiated testing of a base station (BS) device under test (DUT) disposed in the MPAC, the test system comprising:

with an analog beam former circuit of user equipment (UE), weighting UE antenna elements in accordance with first beam indices to cause Q UE antenna array beam patterns to be formed by Q UE antenna arrays, respectively, of the UE, where Q is a positive integer that is greater than or equal to two, each of the Q UE antenna arrays comprising a plurality of the UE antenna elements;

with a radio channel (RC) emulator having at least Q RC input/output (I/O) ports electrically coupled to the Q UE antenna ports, respectively, and having P RC I/O ports, where P is a positive integer that is greater than or equal to two, performing RC emulation during which a dynamically-variable channel model of the RC emulator is dynamically varied by the RC emulator in accordance with beam index information to include cluster-wise probe antenna weighting, the beam index information including at least the first beam indices; and in an MPAC having a plurality of antenna probes that are electrically coupled to the P RC I/O ports and that are in a selected configuration, dynamically varying cluster-wise weighting of the probe antennas in accordance with dynamic variations to the dynamically-varying channel model.

21. The method of claim 20, wherein the BS DUT has N BS antenna arrays capable of generating N BS antenna array beam patterns, respectively, and wherein the selected configuration of the probe antennas is a preselected configuration made prior to testing, the method further comprising:

prior to performing radiated testing, preselecting the configuration of the probe antennas based on a determination by the RC emulator during a beam power simulation of which pairs of the N BS antenna array beam patterns and the Q UE antenna array beam patterns are the M strongest pairs of the N BS antenna array beam patterns and Q UE antenna array beam patterns, where M is a positive integer that is less than N.

22. The method of claim 20, wherein the selected configuration of the probe antennas is a preselected configuration made prior to testing, the method further comprising:

prior to performing radiated testing, preselecting the configuration of the probe antennas based on a determination made by the RC emulator during a beam power simulation of which of the Q UE antenna array beam patterns are the M strongest UE antenna array beam patterns, where M is a positive integer that is less than N.

23. The method of claim 20, wherein the cluster-wise probe antenna weighting is dynamically updated within the dynamically-variable channel model in accordance with the beam index information.

24. The method of claim 20, wherein the selected configuration of the probe antennas is dynamically selected while performing radiated testing, the method further comprising:

with the RC emulator, using a switch that is electrically coupled to the P RC I/O ports and to the antenna probes to dynamically select the configuration of probe antennas to be used during radiated testing.

\* \* \* \* \*